(12) United States Patent
Naaman

(10) Patent No.: US 11,588,472 B1
(45) Date of Patent: Feb. 21, 2023

(54) PURCELL FILTER HAVING PRESCRIBED TRANSFER CHARACTERISTICS

(71) Applicant: Google LLC, Mountain View, CA (US)

(72) Inventor: Ofer Naaman, Santa Barbara, CA (US)

(73) Assignee: Google LLC, Mountain View, CA (US)

( * ) Notice: Subject to any disclaimer, the term of this patent is extended or adjusted under 35 U.S.C. 154(b) by 294 days.

(21) Appl. No.: 17/109,362

(22) Filed: Dec. 2, 2020

Related U.S. Application Data

(60) Provisional application No. 62/947,557, filed on Dec. 13, 2019.

(51) Int. Cl.
| | |
|---|---|
| *G06N 10/00* | (2022.01) |
| *H03H 11/04* | (2006.01) |
| *B82Y 10/00* | (2011.01) |

(52) U.S. Cl.
CPC .............. *H03H 11/04* (2013.01); *B82Y 10/00* (2013.01); *G06N 10/00* (2019.01)

(58) Field of Classification Search
CPC ......... H03H 11/04; G06N 10/10; B82Y 10/00
See application file for complete search history.

(56) References Cited

U.S. PATENT DOCUMENTS

| | | | |
|---|---|---|---|
| 9,444,430 B1* | 9/2016 | Abdo | ..................... G06N 10/00 |
| 2012/0320668 A1 | 12/2012 | Lewis et al. | |
| 2018/0260732 A1 | 9/2018 | Bloom et al. | |
| 2018/0336153 A1 | 11/2018 | Naaman et al. | |
| 2019/0156238 A1 | 5/2019 | Abdo | |

FOREIGN PATENT DOCUMENTS

WO    WO 2018106222 A1 *   6/2018

OTHER PUBLICATIONS

Bronn, Nicholas T., et al., Broadband Filters for Abatement of Spontaneous Emission in Circuit Quantum Electrodynamics, arXiv:1508.01743v2 [quant-ph] Oct. 29, 2015, pp. 1-5.

Chuang, Isaac, et al., Lecture 19: How to Build Your Own Quantum Computer, Department of Mathematics, MIT, 2003, pp. 1-4.

Cleland, Agnetta, et al., Mechanical Purcell Filters for Microwave Quantum Machines, arXiv:1905.08403v1 [quant-ph] May 21, 2019, pp. 1-5.

Jeffrey, Evan, et al., Fast Accurate State Measurement with Superconducting Qubits, Physical Review letters, American Physical Society, PRL 112, 190504 (2014), pp. 1-5.

Matthaei, G.L., et al., Design of Microwave Filters, Impedance Matching Networks, and Coupling Structures, Stanford Research Institute, 1963, pp. 1-526.

(Continued)

*Primary Examiner* — Dinh T Le
(74) *Attorney, Agent, or Firm* — Botos Churchill IP Law

(57) ABSTRACT

The technology relates to quantum computing devices and test arrangements for detecting information from the qubits of such devices. According to aspects of the technology, a Purcell filter is structured in a multi-pole architecture to provide a sharper filter response having a flatter signal pass band, sharper turn-off skirt, and enhanced out of band rejection. The system is able to determine the states of the qubits by detecting the frequency of the readout resonators of the test arrangement. The Purcell filter is configured to be sharply tuned to enable faster readout to avoid issues associated with a longer relaxation time (T1) of the qubits.

22 Claims, 17 Drawing Sheets

(56) References Cited

OTHER PUBLICATIONS

Reed, M.D., et al., Fast reset and suppressing spontaneous emission of a superconducting qubit, Applied Physics Letters 96, 203110 2010, pp. 1-4.
Sete, Eyob, et al., Quantum theory of a bandpass Purcell filter for qubit readout, arXiv: 1504.06030v2 [quant-ph] Jul. 22, 2015, pp. 1-15.
Bronn, et al., "Fast, High-Fidelity Readout of Multiple Qubits", IOP Publishing, doi: 10.1088/1742-6596/834/1/012003, 2017, pp. 1-10.
Govia, et al., "Enhanced Qubit Readout Using Locally Generated Squeezing and Inbuilt Purcell-Decay Suppression", New Journal of Physics, vol. 19, 2017, pp. 1-16.
McKay, et al., "A Multi-Resonator Network for Superconducting Circuits", 2014, pp. 1-6.

\* cited by examiner

300

K-type inverter

φ = negative

310

J-type inverter

φ = negative

400

430

460

500

800

810

900'

$$K' = K_{M-1,M}\sqrt{N}$$

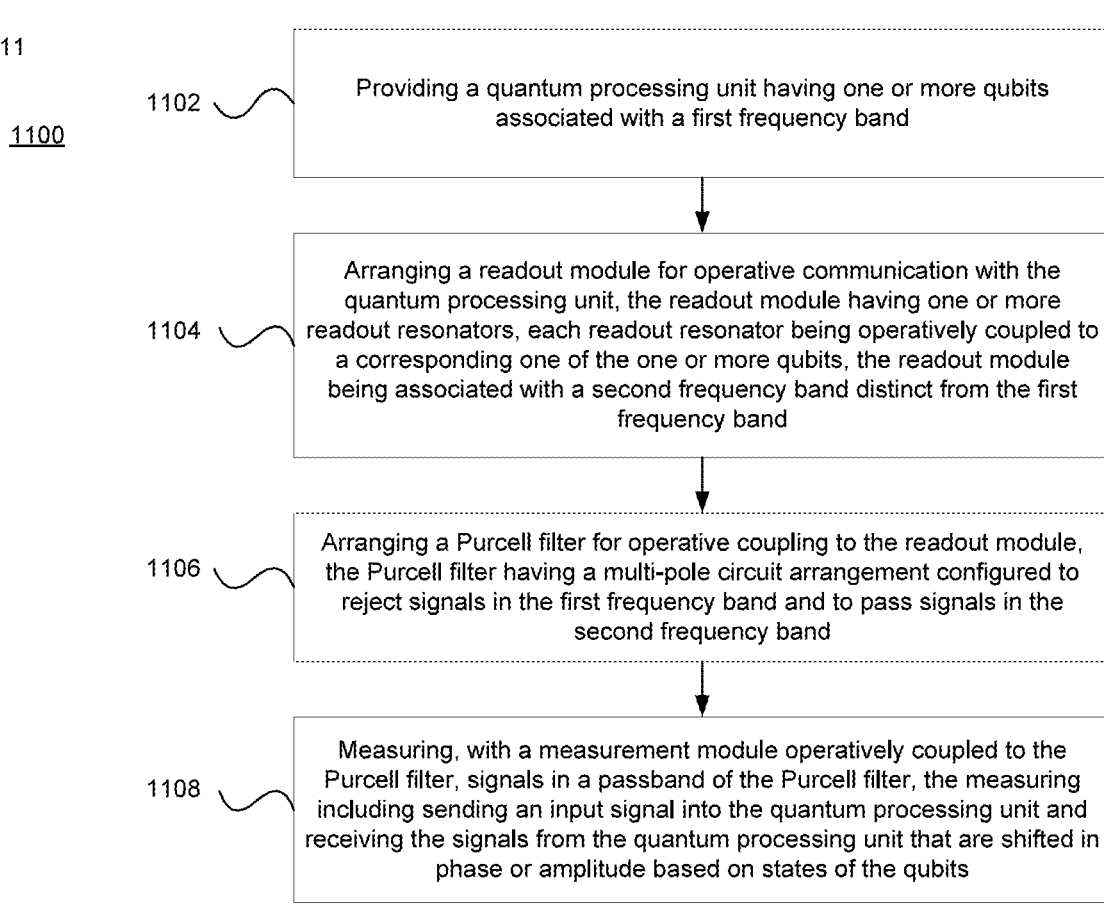

PURCELL FILTER HAVING PRESCRIBED TRANSFER CHARACTERISTICS

CROSS-REFERENCE TO RELATED APPLICATIONS

This application claims the benefit of the filing date of U.S. Provisional Application No. 62/947,557, filed Dec. 13, 2019, the entire disclosure of which is incorporated by reference herein.

BACKGROUND

Large-scale quantum computers have the potential to provide fast solutions to certain classes of difficult problems. Multiple challenges in the design and implementation of quantum architecture to control, program and maintain quantum hardware impede the realization of large-scale quantum computing. Such challenges include accurate and fast readout of information from the qubits of the quantum computer.

To read out the information stored in qubits, the qubits are first made to interact with an input signal. The interaction causes a response, which is used to provide information about the state of the qubits. In order to provide such information, the response is read out from the qubits using a measurement and readout system. In some arrangements, a Purcell filter is included in the readout signal chain. For instance, single-pole based pass band filters have been employed in various arrangements. Such filters provide a passband of certain frequencies while rejecting other frequencies. However, existing approaches may have limited rejection levels and little design flexibility for different quantum processor implementations.

BRIEF SUMMARY

According to aspects of the technology, a Purcell filter is structured with a singly-terminated arrangement that allows for measurement of the qubit response in reflection from a single port. The readout resonators couple to either an open-terminated or short-terminated end of the Purcell filter. Multiple pole filters having reactive elements corresponding to, e.g., 2, 3 or 4 poles may be employed. More poles provide a sharper filter response, in particular a flatter signal pass band, sharper turn-off skirt, and enhanced out of band rejection. While this provides significant signal readout benefits, it may also result in a larger component that needs to be accommodated by the quantum computing device. As discussed further below, the architectures presented herein can be adapted based on component and other hardware needs in order to accommodate different quantum computing approaches.

In one aspect, a quantum processing system is provided that includes a quantum processing unit, a readout module, a Purcell filter and a measurement module. The quantum processing unit comprises one or more qubits, with the qubits being associated with a first frequency band. The readout module comprises one or more readout resonators. Each readout resonator is operatively coupled to a corresponding one of the one or more qubits. The readout module is associated with a second frequency band distinct from the first frequency band. The Purcell filter is operatively coupled to the readout module. The Purcell filter has a multi-pole circuit arrangement configured to reject signals in the first frequency band and to pass signals in the second frequency band. And the measurement module is operatively coupled to the Purcell filter. The measurement module is configured to detect signals in a passband of the Purcell filter.

The Purcell filter may have a singly-terminated arrangement enabling measurement of the one or more qubits by the measurement module in reflection from a single port.

The Purcell filter may have a three pole configuration. For instance, the three pole configuration may be open-terminated or short-terminated.

In one scenario, the Purcell filter includes a first grounded inductive element coupled to a first transmission line element of a first one of the poles, a second grounded inductive element coupled to a second transmission line element of a second one of the poles and to a third transmission line element of a third one of the poles, and a capacitor in series between the first transmission line element and either the second or third transmission line element. The third transmission line element may embed or otherwise comprise at least first and second discrete transmission line elements, which are coupling elements (e.g., an inductor, capacitor, and/or coupled-lines element) that couple with the one or more readout resonators. Here, the second discrete transmission line element is arranged so that the third transmission line element has an electrical length on the order of 90 degrees at a center frequency of the second frequency band. The first discrete transmission line element may comprise one pair of discrete elements, and the second discrete transmission line element comprises another pair of discrete elements.

In another scenario, the Purcell filter may include a first capacitor coupled to a first transmission line element of a first one of the poles, a second capacitor coupled in series to a second transmission line element of a second one of the poles and to a third transmission line element of a third one of the poles, and a grounded inductive element between the first transmission line element and either the second or third transmission line element.

In a further scenario, the Purcell filter includes a pair of grounded transmission line elements coupled to a first transmission line element of a first one of the poles, a grounded inductive element coupled to a second transmission line element of a second one of the poles and to a third transmission line element of a third one of the poles, and a capacitor in series between the first transmission line element and either the second or third transmission line element. The pair of grounded transmission line elements may be ⅛ wavelength transmission line stubs.

In one example, the Purcell filter has a two pole configuration. For instance, the two pole configuration may be open-terminated or short-terminated.

In yet another scenario, the Purcell filter includes a grounded inductive element coupled to a first transmission line element of a first one of the poles, a coupling element coupled in series to a second transmission line element of a second one of the poles, and a capacitor in series between the first transmission line element and the second transmission line element. Here, the coupling element may be one of an inductor, a capacitor or a coupled-line segment.

In a further scenario, the Purcell filter has a four pole configuration. For instance, the Purcell filter may include a first grounded inductive element coupled to a first transmission line element of a first one of the poles, a first capacitor in series between the first transmission line element and a second transmission line element of a second one of the poles, a second grounded inductive element coupled to the second transmission line element and to a third transmission line element of a third one of the poles, a second capacitor in series between the third transmission line element and a fourth transmission line element of a fourth one of the poles, and a third grounded inductive element coupled to the fourth transmission line and opposite the second capacitor.

In an example, at least one resonant section of the Purcell filter comprises a lumped element resonator. In another example, the multi-pole circuit arrangement of the Purcell filter further includes at least one transmission line element arranged to provide an electrical length of an integer multiple of 90 degrees at a center frequency of the filter and arranged to couple with the one or more readout resonators.

In a further example, the first frequency band is on the order of 6-8 GHz. And alternatively or additionally, the second frequency band is spaced at least 1 GHz from the first frequency band.

In one configuration, the one or more qubits of the quantum processing unit are a plurality of qubits, the one or more readout resonators of the readout module are a plurality of readout resonators, and each of the readout resonators is operatively coupled to a corresponding one of the plurality of qubits.

In accordance with another aspect, a method of reading out a quantum processing unit comprises detecting a signal in the passband of at least one Purcell filter comprised in the quantum processing system in any of the configurations discussed above.

And in another aspect, a method of reading out a quantum processing unit is provided. The method comprises providing a quantum processing unit having one or more qubits, the qubits being associated with a first frequency band; arranging a readout module for operative communication with the quantum processing unit, the readout module having one or more readout resonators, each readout resonator being operatively coupled to a corresponding one of the one or more qubits, the readout module being associated with a second frequency band distinct from the first frequency band; arranging a Purcell filter for operative coupling to the readout module, the Purcell filter having a multi-pole circuit arrangement configured to reject signals in the first frequency band and to pass signals in the second frequency band; and measuring, with a measurement module operatively coupled to the Purcell filter, signals in a passband of the Purcell filter, the measuring including sending an input signal into the quantum processing unit and receiving the signals from the quantum processing unit that are shifted in phase or amplitude based on states of the qubits.

BRIEF DESCRIPTION OF THE DRAWINGS

FIG. 11 illustrates a method in accordance with aspects of the disclosure.

DETAILED DESCRIPTION

Overview

Aspects of the technology employ multi-pole Purcell filter arrangements in quantum computing architectures. The system is able to determine the states of the qubits by detecting the frequency of the readout resonators. For example, the system may send a microwave signal tuned to the resonator frequency, and via reflection or transmission determine the state of the qubits. However, the resonators can affect the qubits' states as a result of coupling to a resistive environment. The presence of a readout resonator can enhance the qubit decay rate by the so-called Purcell effect.

While there may be weak coupling between the resonator module and the measurement apparatus measuring the signals, such coupling can result in a longer readout time, which can adversely impact the quality of signal readout. This could be problematic in certain contexts depending on the relaxation time (T1) of the qubits. In other contexts, for instance in error-correction routines, qubits need to be read-out repeatedly, slow readout is also a concern, because the system cannot correct errors that occur while waiting a long time for the readout operation to complete. Stronger coupling is therefore more desirable for faster readout. In many cases, stronger coupling can imply smaller frequency offset between the qubit and its readout resonator, thus, a Purcell filter with a sharp roll-off is needed to achieve these design goals.

As used herein, the term "Purcell filter" may preferably be used to connote a bandpass filter for suppressing the Purcell effect in qubits. For instance, a Purcell filter may reduce the Purcell effect by suppressing signal propagation at qubit transition frequencies, while allowing readout frequencies to pass without substantial suppression.

Example Implementations

Figure 1:
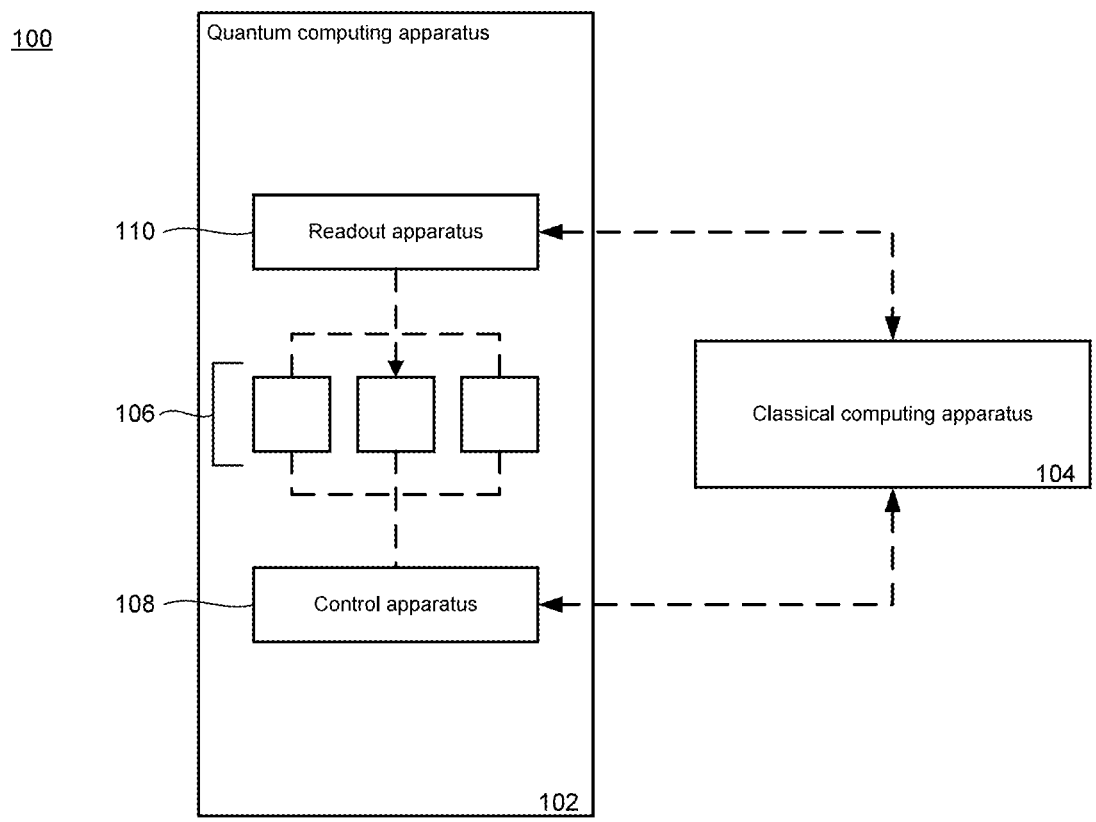
FIG. 1 illustrates an example quantum processing unit arrangement in accordance with aspects of the technology.

FIG. 1 shows an overview of an exemplary quantum computing system 100. The system comprises a quantum computing apparatus 102 and a classical computing apparatus 104. The quantum computing apparatus 102 comprises one or more physical qubits 106. In the example shown, three qubits 106 are present, though more or fewer qubits can be used. Each qubit 106 is a physical system with three or more quantum levels. Two of the quantum levels are taken to form the computational subspace, i.e., the states |0> and |1>. These may, in some implementations, be the lowest two energy states of the physical system being used as a qubit. The remaining one or more states form the non-computational subspace, i.e., |2>, |3> etc.

In some implementations, the one or more qubits 106 may be superconducting qubits. For example, the one or more qubits 106 may be transmon, fluxmon, fluxonium, or capacitively-shunted flux qubit. In other implementations other semiconductor-based qubit architectures may be used instead, such a system based on quantum dots and spin qubits.

The quantum computer further comprises a control apparatus 108. The control apparatus 108 is configured to apply control signals to the qubits 106 in order to alter a state or property of the qubits. For example, the control apparatus 108 can apply control signals to the qubits 106 in order to implement one or more quantum gates on the qubits 106. The control apparatus 108 may include one or more control lines for transmitting control signals to the one or more qubits 106. The control signals may, for example, comprise control pulses for altering states on the one or more qubits 106. Such control pulses may be, e.g., in the form of microwave control pulses. An example of such a microwave control pulse is a π-pulse, which acts to exchange the populations (e.g., the amplitudes) of quantum states in the one or more qubits 106.

As shown, the quantum computer further includes a readout apparatus 110. The readout apparatus 110 is configured to perform measurements on the one or more qubits 106. Performing measurements involves sending a signal into the system and receiving a signal out of the system, where the received signal is shifted in phase or amplitude based on the qubit state. Thus, based on the results of the measurements, the readout apparatus 110 provides output indicative of the state of the one or more qubits 106. For example, the readout apparatus 110 may provide an output of "0" or "1" corresponding to the |0> and |1> states of the qubit respectively for each of the qubits in the assembly. As another example, the readout apparatus 110 may provide an output of "00", "01", "10", or "11" corresponding to the 2-qubit |00>, |01>, |10> and |11> states of the qubit respectively. In the implementation shown, the readout apparatus 110 is a separate component to the control apparatus 106. However, in other implementations the readout apparatus 110 may be a part of the control apparatus 108.

The classical computing apparatus 104 may interact with the control apparatus 108 to control operation of the control apparatus 108. For example, a user interface for the control apparatus 104 (not shown) may be provided through the classical computing apparatus 104. The classical computing apparatus 104 may also process measurement data/readout states from the readout apparatus 110 to determine properties of the qubits 106, such as the average population of quantum states.

Figure 2:
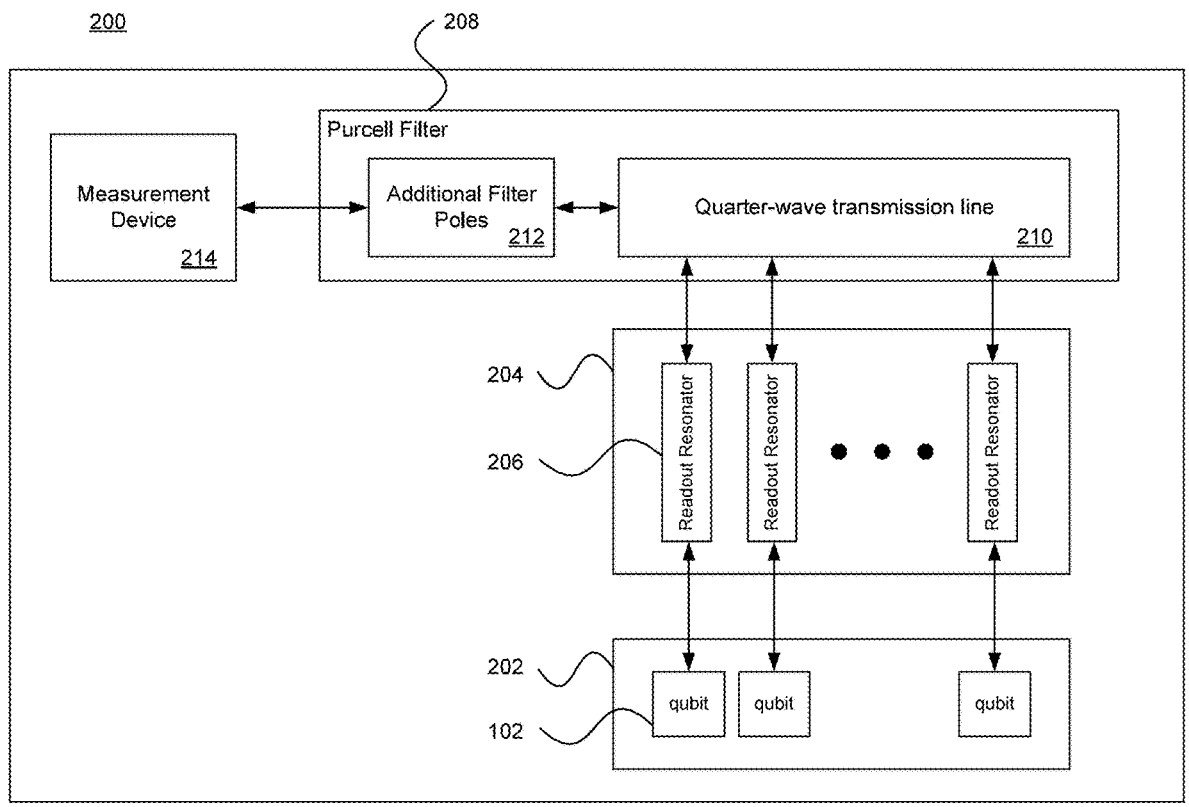
FIG. 2 illustrates a functional arrangement for a quantum processing system in accordance with aspects of the technology.

FIG. 2 illustrates an example functional arrangement 200 for, e.g., quantum processing unit 102 of FIG. 1. As shown, the quantum processing unit includes a plurality of qubits 202. A readout module 204 includes a set of readout resonators 206, where each readout resonator is operatively engaged with a corresponding qubit. The readout module 204 is connected to Purcell filter 208. As shown in this example, the readout resonators 206 are coupled to a quarter-wave transmission line (TL) 210 of the Purcell filter. The transmission line 210 is connected to one or more additional poles 212 of the Purcell filter (reactive elements, e.g., inductance elements and/or capacitors, or transmission line segments), and the Purcell filter is coupled with a measurement device 214. The measurement device is configured to provide the information associated with the readout from the qubits to other system elements for analysis and/or further processing (e.g., error correction).

By way of example, the Purcell filter may be associated with a filter frequency, each readout resonator of the readout module may be associated with a readout frequency in a first frequency band, and each qubit may be associated with a qubit frequency in a second frequency band distinct from the first frequency band. The difference between each qubit frequency and the corresponding readout frequency may be greater than a difference between the readout frequency and the filter frequency. The readout resonators obtain the information stored in the qubits, and the Purcell filter suppresses the Purcell effect in the qubits (in accordance with the pass-band of the filter), thereby enabling higher readout efficiency.

According to aspects of the technology, the architecture needs the pass-band to be able to accommodate multiple readout resonators, where each resonator has a distinct allocated spectral channel (e.g., 20-50 MHz). Thus, if the system needs to accommodate 10 resonators, there would need to be, for example, 200-500 MHz of passband. In addition, the filter needs a sharp cutoff, so that with a selected amount of detuning (e.g., ~1 GHz) of each qubit from its readout resonator, the filter will provide better than 20 dB rejection.

Figure 3A:
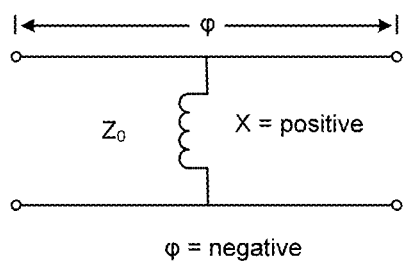
FIGS. 3A-B illustrate example inverter types for use with aspects of the technology.
Figure 3B:
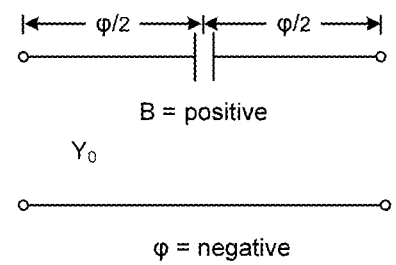

As shown in the figures and described below, various Purcell filter configurations may be employed, although the technology is not limited to these specific configurations. The configurations may be considered duals of one another that use a K-type as shown in example 300 of FIG. 3A or a J-type inverter as shown in example 310 of FIG. 3B. As illustrated in the examples below, the filters use combinations of inductive, capacitive and transmission line elements.

Figure 4A:
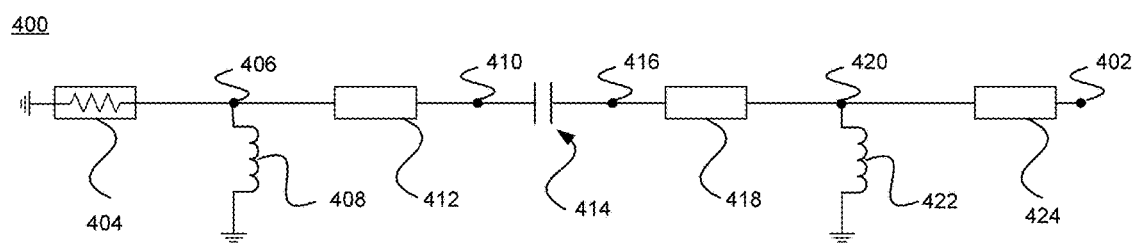
FIGS. 4A-C illustrate example Purcell filter architectures in accordance with aspects of the disclosure.

In particular, one 3-pole filter configuration 400 is open terminated at node 402, as shown in FIG. 4A. Opposite open terminated node 402 is a grounded termination element 404, which may have, e.g., an impedance on the order of 50 ohms, representing the impedance of the measurement device 214. Coupled to the termination element 404 at node 406 is a first grounded inductance element 408. Between node 406 and node 410 is a transmission line element 412. A capacitor 414 is coupled between node 410 and node 416. In series with capacitor 414 is another transmission line element 418 between node 416 and node 420. A second grounded inductance element 422 is coupled to node 420. And between nodes 402 and 420 is a third transmission line element 424, for instance corresponding to quarter-wave transmission line 210 of FIG. 2. According to one aspect, the third transmission line may be embedded with coupling elements that couple it to at least one readout resonator. Furthermore, the total electrical length of the third transmission line is essentially 90 degrees at the center of the filter pass-band.

Figure 4B:
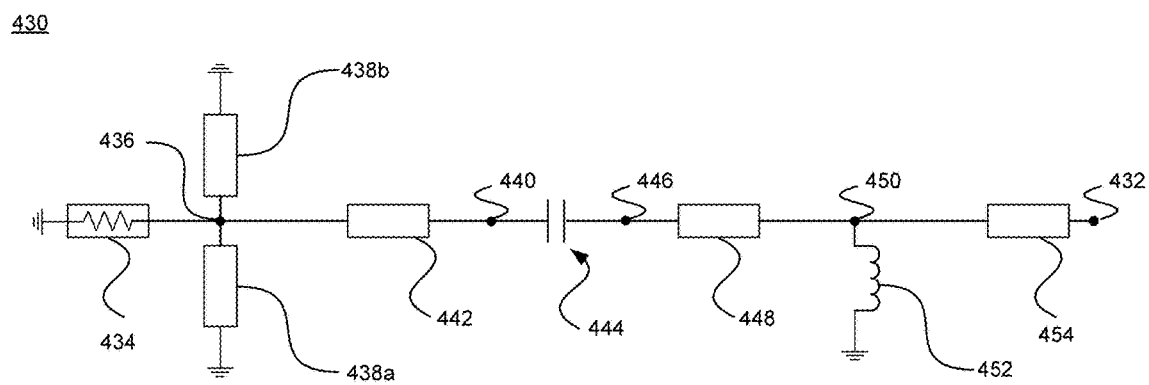

FIG. 4B illustrates a filter variant 430 of FIG. 4A in which one inductor arrangement of FIG. 4A is replaced by a pair of ⅛ wavelength transmission line stubs. In particular, the configuration 430 is open terminated at node 432. Opposite open terminated node 432 is a grounded termination element 434, which may have, e.g., an impedance on the order of 50 ohms. Coupled to the termination element 434 at node 436 are first grounded transmission line element 438a and second grounded transmission line element 438b, which are the ⅛ wavelength transmission line stubs. Between node 436 and node 440 is a transmission line element 442. A capacitor 444 is coupled between node 440 and node 446. In series with capacitor 444 is another transmission line element 448 between node 446 and node 450. A second grounded inductance element is coupled to node 450. And between nodes 432 and 450 is a third transmission line element 454, for instance corresponding to quarter-wave transmission line 210 of FIG. 2. Accordingly, this filter variant is easier to implement in a single-layer, planar fabrication process.

Figure 4C:
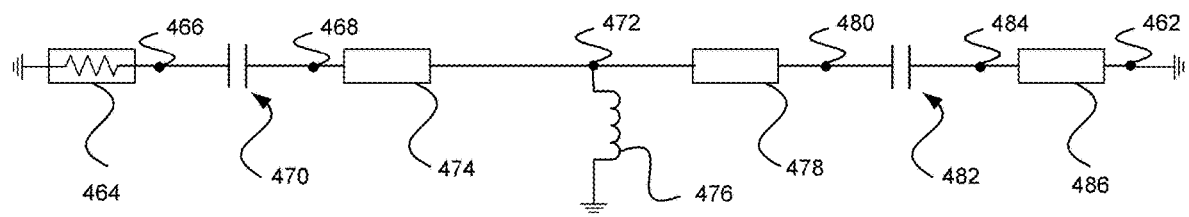

As shown in FIG. 4C, another 3-pole filter configuration 460 is grounded at node 462. Opposite grounded node 462 is a grounded termination element 464, which may have, e.g., an impedance on the order of 50 ohms, representing the impedance of the measurement device 214. Coupled to the termination element 464 between node 466 and node 468 is a first capacitor 470. Between node 468 and node 472 is a transmission line element 474. A grounded inductance element 476 is coupled to node 472. Another transmission line element 478 is disposed between node 472 and node 480. A second capacitor 482 is coupled between nodes 480 and 484. And between nodes 462 and 484 is a third transmission line element 486, for instance corresponding to quarter-wave transmission line 210 of FIG. 2.

In these and other example Purcell filter architectures, the particular values chosen for transmission lines, capacitive and inductive elements depend on system parameters. For instance, the qubit frequency of interest may be on the order of 6-8 GHz, while the readout resonators operate at a different frequency, such as 1 GHz away from the qubit frequency (higher or lower).

Per Table I below (which relates to a 3-pole scenario), given Wo the center frequency of the filter band, $Z_0$ ($Y_0$) the transmission line element impedances (admittances), w the fractional bandwidth of the filter, and filter coefficients {g0=1, g1, g2, g3, g4=inf}, imittance inverter values can be calculated (see (a) below), from which reactances are obtained (see (b) below) and coupling component values (see (c) below). The extra phases associated with the imittance inverters can also be calculated (see (d) below), and the electrical lengths of the transmission line element segments (see (e) below). The values from (c) and (e) are used in the filter circuit 400 of FIG. 4A. Table 1 is obtained from information presented in the text "Design of Microwave Filters, Impedance-Matching Networks, and Coupling Structures, Volume I" by Matthaei, Young, and Jones (1963).

metals such as Nb, Ta or TiN, where the transmission line has a coplanar waveguide geometry. For this geometry, it is feasible to implement impedances in the range of 20-100 ohms.

Figure 5:
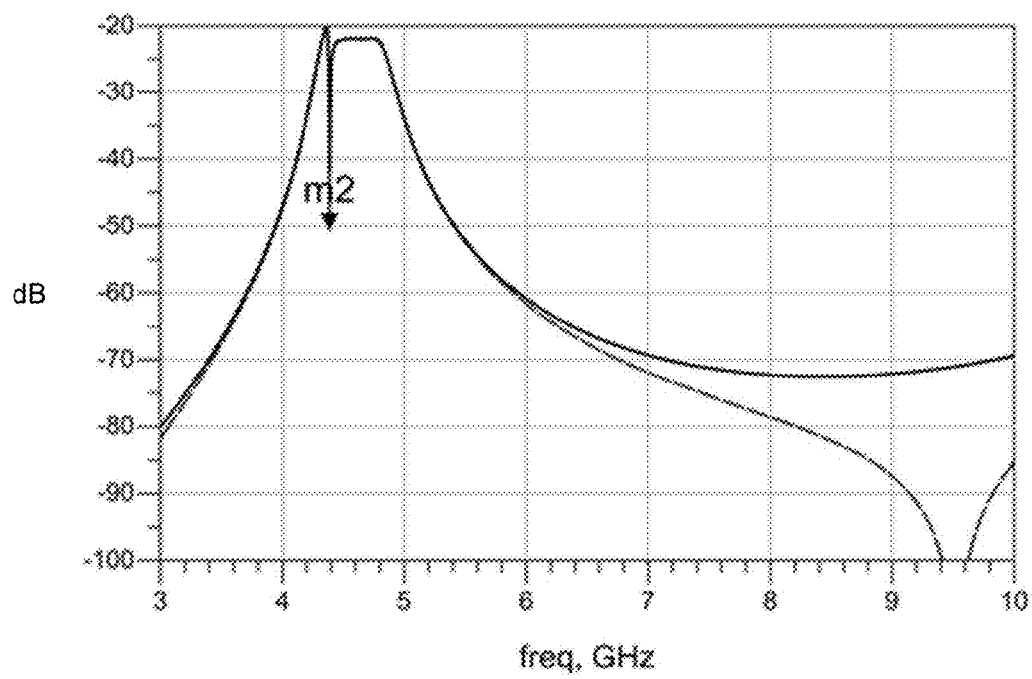
FIG. 5 illustrates a simulated frequency response for the examples of FIGS. 4A and 4C in accordance with aspects of the technology.

FIG. 5 shows a simulated frequency response for FIGS. 4A (dashed line) and 4C (solid line). In particular, FIG. 5 shows simulation of the current flowing towards node 420 from transmission line element 424 of FIG. 4A, and towards ground at node 462 of FIG. 4C, for a filter designed with a 0.1 dB ripple Chebychev response, center frequency of 4.575 GHz and bandwidth of 400 MHz. A resonator at 4.4 GHz (not shown in the schematic of FIGS. 4A-C) is operatively coupled to transmission line 424 (or 486), and the result is visible in FIG. 5 at point m2. Using the equations above from Table I, the electrical length (e) of the transmission line resonator elements 412 and 474 in the respective filter circuits of FIGS. 4A and 4C is calculated to be e1=64.8 deg. The electrical length of the transmission line resonator elements 418 and 478 is calculated to be e2=81.2 deg. And the electrical length of the transmission line resonator elements 424 and 486 is calculated to be and e3=86.4 deg.

In the open-terminated case of FIG. 4A, the inductance of inductor element 408 ($L_{01}$)=0.73 nH, capacitor element 414 ($C_{12}$)=64 fF, and the inductance of inductor element 422 ($L_{23}$)=0.11 nH. As explained above, the variant in FIG. 4B replaces inductor element 408 with two 45 degree (⅛ wavelength) stubs 438a and 438b, here with $Z_{stub}$=42 ohms. In the dual circuit of FIG. 4C that is short terminated, the capacitance of capacitor 470 ($C_{01}$)=0.292 pF, the inductance of inductor element 478 ($L_{12}$)=0.16 nH, and the capacitance of capacitor 482 ($C_{23}$)=44 fF. Given this, the Purcell-limited T1 at 1 GHz detuning from the resonator frequency is T1=390 μs for the open terminated architecture, and 380 μs for the short terminated architecture.

The calculated T1 due to Purcell effect should be viewed as "worst case" corresponding to a qubit at the minimum

TABLE I

| a) | b) | c) | d) | e) |
|---|---|---|---|---|
| $K_{01} = Z_0 \sqrt{\dfrac{\pi \omega}{4 g_0 g_1}}$ | $X_{01} = \dfrac{K_{01}}{1 - \left(\dfrac{K_{01}}{Z_0}\right)^2}$ | $L_{01} = X_{01}/\omega_0$ <br> $C_{12} = B_{12}/\omega_0$ <br> $L_{23} = X_{23}/\omega_0$ | $\phi_{01} = \tan^{-1}(2X_{01}/Z_0)$ <br> $\phi_{12} = \tan^{-1}(2B_{12}/Y_0)$ <br> $\phi_{23} = \tan^{-1}(2X_{23}/Z_0)$ | $e_1 = (\pi - \phi_{01} - \phi_{12})/2$ <br> $e_2 = (\pi - \phi_{13} - \phi_{23})/2$ <br> $e_3 = (\pi - \phi_{23})/2$ |
| $J_{12} = Y_0 \dfrac{\pi \omega}{4 \sqrt{g_1 g_2}}$ | $B_{12} = \dfrac{J_{12}}{1 - \left(\dfrac{J_{12}}{Y_0}\right)^2}$ | | | |
| $K_{23} = Z_0 \dfrac{\pi \omega}{4 \sqrt{g_2 g_3}}$ | $X_{23} = \dfrac{K_{23}}{1 - \left(\dfrac{K_{23}}{Z_0}\right)^2}$ | | | |

The filter circuit 460 in FIG. 4C can be designed similarly to the filter circuit 400 of FIG. 4A. For instance, the above equations can be used by making the duality substitutions: K↔J, X↔B, L↔C, and Z↔Y. The circuit variant 430 in FIG. 4B is obtained from FIG. 4A by the Richards transformation of inductor 408 having inductance $L_{01}$ into two parallel 45 deg (⅛ wavelength) transmission lines 438a and 438b, each with impedance $Z_{stub}=2L_{01}\omega_0$. This example uses 2 parallel transmission lines so the line impedance is higher and closer to 50 ohms. Depending on the fabrication of the filter and other system components, using low impedance lines a variant of FIG. 4B would have one stub transmission line 438 with half the impedance $Z_{stub}/2$. In some scenarios, the chip elements may be fabricated using single layer Al on Sapphire or Si or other superconductive distance from the filter band-edge. In particular, it is worst case in a sense that the qubit is connected to the lowest-frequency resonator, and the qubit frequency is above the resonator frequency. Therefore this particular qubit is closest to the upper cutoff frequency of the filter. Other qubits that could be connected to the same filter will have higher frequencies, and therefore would see more rejection from the filter.

In these examples, the readout resonator is connected to the open or short terminated transmission line (424, 454 or 486) via a coupled-line coupler having electrical length of 5 degrees, a coupling coefficient of k=0.19 ($Z_{even}$=60.4 ohms, $Z_{odd}$=41.4 ohms), giving resonator K/2π=1.5 MHz into 50 Ohm. κ is the energy decay rate, which may be viewed essentially as an RC time constant. It is equivalent to $\omega_0/Q$ where $\omega_0$ is the readout resonator frequency and Q is the loaded quality factor for the readout resonator. The overall κ through the Purcell filter is ~4 MHz.

Figure 6A:
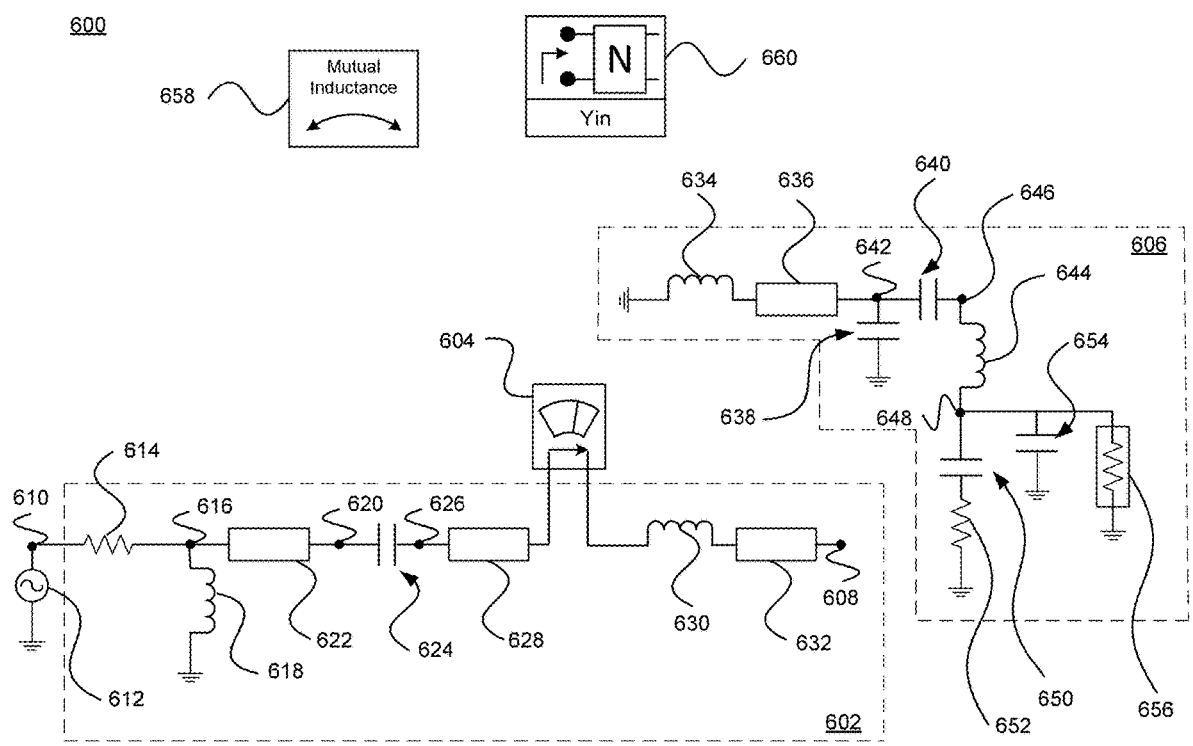
FIGS. 6A-B illustrate example test arrangements in accordance with aspects of the technology.

FIG. 6A illustrates an example test arrangement 600 for a 2-pole filter. In particular, FIG. 6A shows a 2-pole solution that includes Purcell filter 602, a probe 604 and a test bench 606 to test the qubit Purcell-limited T1. The filter 602 is open terminated at node 608. Opposite open terminated node 608 is node 610, at which an AC voltage source 612 is coupled to resistor element 614, which may have, e.g., an impedance on the order of 50 ohms. Coupled to the resistive element 614 at node 616 is a grounded inductance element 618. Between node 616 and node 620 is a transmission line element 622. A capacitor 624 is coupled between node 620 and node 626. In series with capacitor 624 is another transmission line element 628. Probe 604 is disposed between the transmission line element 628 and inductance element 630, which serves as the primary inductance of transformer 658. Inductor 630 can be connected to ground, or, as shown, connected to an additional open-terminated quarter wave transmission line segment 632, for instance to increase the real estate for inductive coupling to a plurality of readout resonators.

The qubit T1 test bench 606 includes a grounded inductance element 634 that serves as the secondary inductance of transformer 658, coupled to a transmission line element 636 representing a readout resonator. The transformer 658 (shown as the box labeled "Mutual Inductance") is thus formed by inductance elements 630 and 634. The transmission line element 636 is coupled to a grounded capacitor 638 and another capacitor 640 at node 642. These capacitors model the coupling of the readout resonator to the qubits at 640, and a parasitic capacitance is modeled as 638. The other end of capacitor 640 is coupled to inductance element 644, modeling a stray inductance of the qubit at node 646. The other end of inductance element 644 is coupled to node 648. One branch off of node 648 has capacitor 650 coupled to grounded resistor 652, which may have, e.g., an impedance on the order of 50 ohms, and models a qubit drive line. Another branch off of node 648 is a grounded capacitor 654, modeling the qubit capacitance. And a third branch off of node 648 is grounded termination element 656, which is de-embedded to extract T1.

As shown at element 658, there is mutual inductance between the filter 602 and the test bench 606. In particular, there is mutual inductance between inductance element 630 and inductance element 634. By way of example, the mutual inductance may be on the order of 20 pH (e.g., between 10-30 pH or more or less). In this scenario, the inductance of element 630 may be, e.g., on the order of 0.02-0.07 nH. Similarly, the inductance of element 634, which is part of the resonator, may also be, e.g., on the order of 0.02-0.07 nH. In contrast, the inductance of element 618 may be 570 pH. The capacitance of capacitor 624 may be, e.g., 58 fF. In contrast, the capacitance of the capacitors of the test bench may be, e.g., between 70-90 fF for capacitor 628, 5-10 fF for capacitor 640, 0.05-0.15 fF for capacitor 650, and 80-110 fF for capacitor 654. And the inductance for element 644 may be on the order of 0.1-0.7 pH. These values are merely exemplary, and may be changed based on the filter configuration, the type of quantum device under test, etc.

The box 660 in FIG. 6A (labeled as $Y_{in}$) is used in the simulation to calculate the admittance seen from termination 656. This (complex) admittance can be used to calculate T1.

Figure 6B:
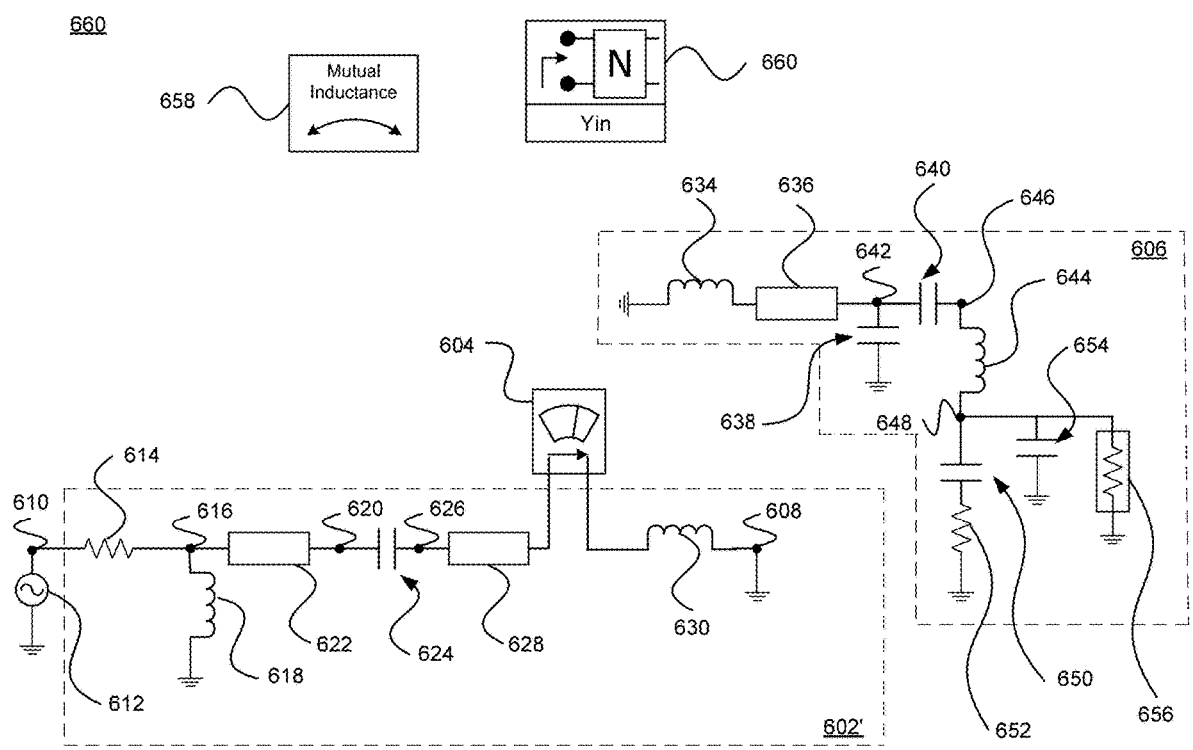

As noted above, transmission line element 632 may be used to increase the real estate available for coupling multiple readout resonators. However, this transmission line may be omitted and replaced by a short circuit. This is shown in the example test arrangement 660 of FIG. 6B, in which node 608 of filter 602' is tied to ground.

The qubit T1 test bench circuitry 606 is employed for simulation purposes and may be used in conjunction with the other example Purcell filter architectures discussed herein, such as shown in FIGS. 4A-C. Since the resonator in the test bench (inductive element 634) is inductively coupled to the Purcell filter, the only thing that will change is the position of that coupling element. For example, with regard to FIG. 4A, inductive element 634 would be connected 'upstream' from transmission line element 424 and nearer to inductive element 422. With regard to FIG. 4C, inductive element 634 would be connected 'downstream' from transmission line element 486, nearer to the short circuit by node 462.

Figure 7:
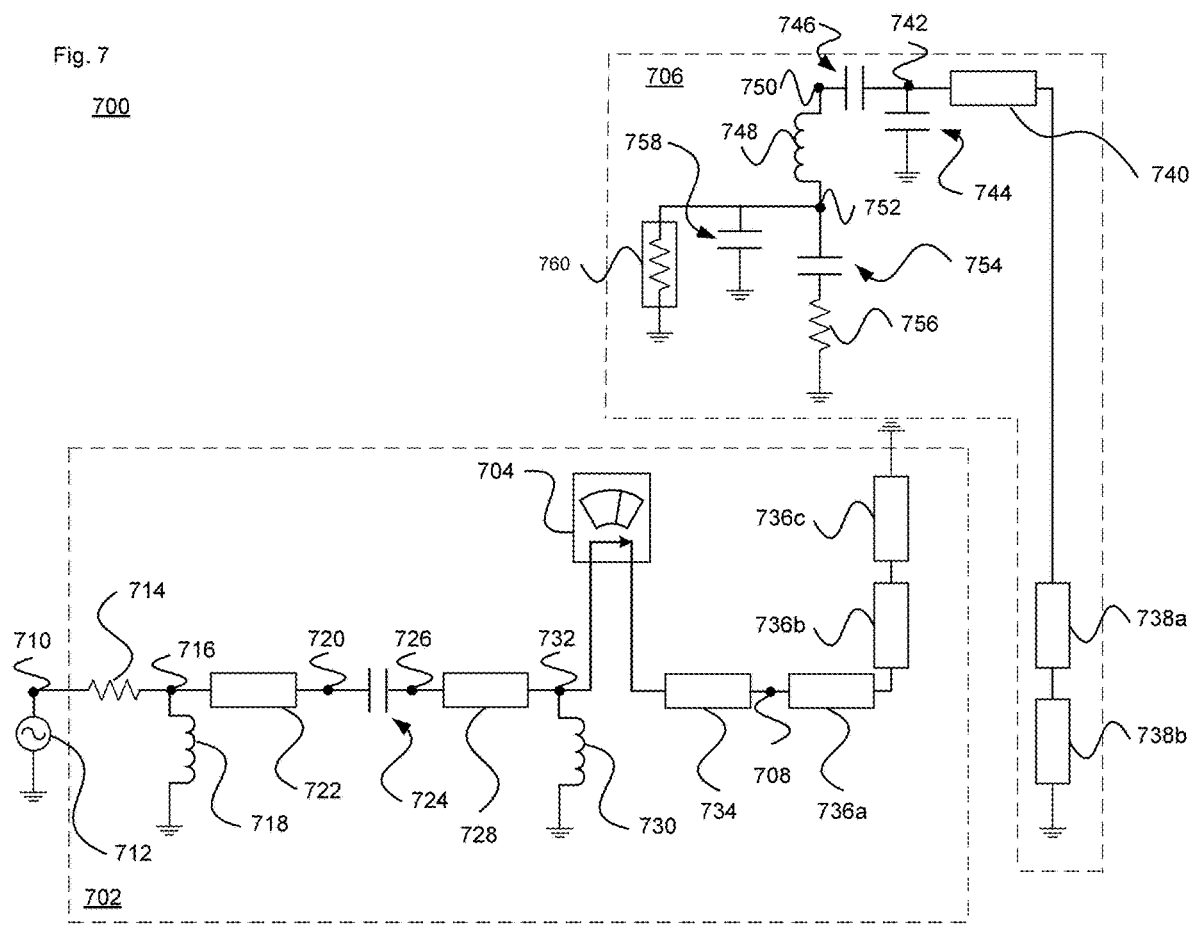
FIG. 7 illustrates another example test arrangement in accordance with aspects of the technology.

FIG. 7 illustrates another example test arrangement 700, which is for a 3-pole filter 702. The filter is similar to the one discussed above for FIG. 4A, but includes an added 90 degree transmission line segment (¼ wavelength) for more coupling real estate with a set of readout resonators. This approach beneficially adds physical real estate (size) for coupling. It also provides an enhanced signal response, including flatter signal pass bands, sharper turn-off skirts, and enhanced out of band rejection.

In particular, FIG. 7 shows Purcell filter 702, a probe 704 and a test bench 706 to test the qubit Purcell-limited T1. Node 708 is coupled to the 90 degree transmission line branch as discussed further below. Opposite node 708 is node 710, at which an AC voltage source 712 is coupled to resistor element 714, which may have, e.g., an impedance on the order of 50 ohms. Coupled to the resistive element 714 at node 716 is a grounded inductance element 718. Between node 716 and node 720 is a first transmission line element 722. A capacitor 724 is coupled between node 720 and node 726. In series with capacitor 724 is another transmission line element 728. Grounded inductance element 730 is coupled to transmission line element 728 at node 732.

In this arrangement, probe 704 is disposed between node 732 and transmission line element 734. Transmission line element 734 is disposed between probe 704 and node 708. And between node 708 and ground is another transmission line element 736, shown as discrete elements 736a, 736b and 736c. In particular, by using discrete element 734 and discrete elements 736a, 736b and 736c, there is an effective 180 degree length to the transmission lines 734 and 736, in particular that the sum of electrical length of transmission lines 734 and 736 is 180 degrees at the center frequency of the filter. This configuration is able to produce a T1 that is sufficiently long to not limit the qubit coherence for the qubit frequency band of interest (e.g., 6-8 GHz). An additional resonance may occur (e.g., above 9 GHz); however, it would be out of this frequency band.

The qubit T1 test bench 706 has a transmission line element 738a, which serves as part of a coupled-transmission-line transformer formed with the Purcell filter segment 736b. The transmission line element 738 is shown as including grounded transmission line element 738b coupled to transmission line element 738a. The transmission line including elements 740, 738a, and 738b acts as a readout resonator operatively coupled to the filter via the coupled-line transformer. Element 738a is also coupled to transmission line element 740, which is connected to node 742. Node 742 is also coupled to a grounded capacitor 744 and another capacitor 746. These capacitors model the coupling of the readout resonator to the qubits at 746, and a parasitic capacitance is modeled as 744. The other end of capacitor 746 is coupled to inductance element 748, modeling a stray inductance of the qubit at node 750. The other end of inductance element 748 is coupled to node 752. One branch off of node 752 has capacitor 754 coupled to grounded resistor 756, which may have, e.g., an impedance on the order of 50 ohms, and models a qubit drive line. Another branch off of node 752 is a grounded capacitor 758, modeling the qubit capacitance. And a third branch off of node 752 is grounded termination element 760, which is de-embedded to extract T1. With respect to Table I, for this example the value of $K_{23}$ increases by a factor of $\sqrt{2}$ and e3 become $\pi - \varphi_{23}/2$.

Figure 8A:
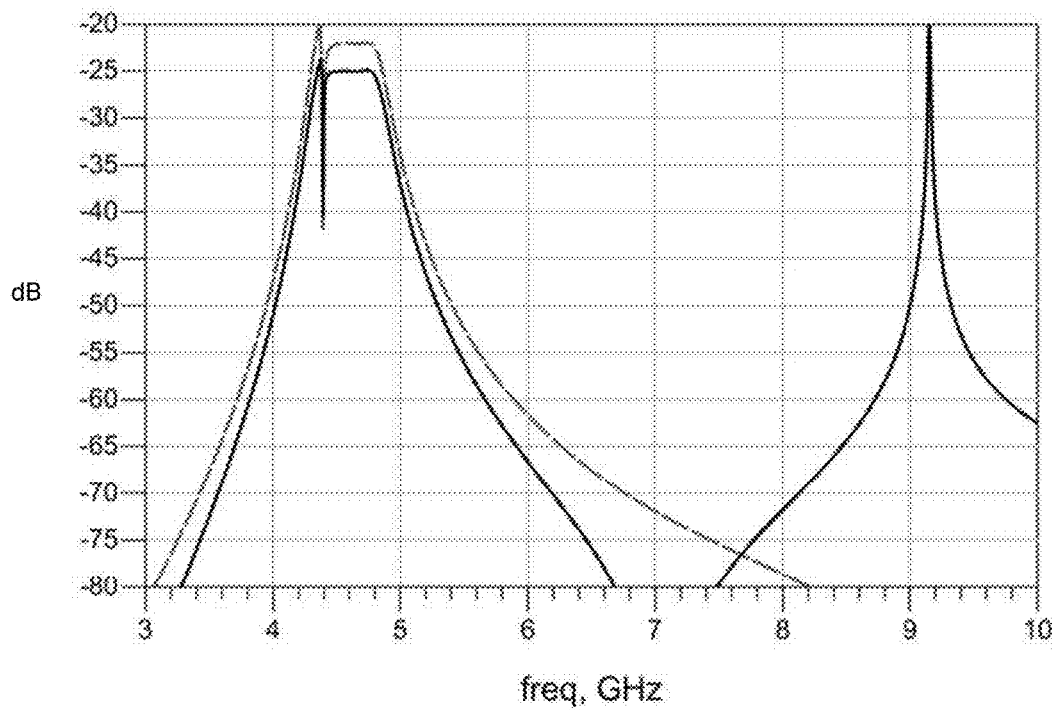
FIG. 8A illustrates a transfer function plot in accordance with aspects of the technology.
Figure 8B:
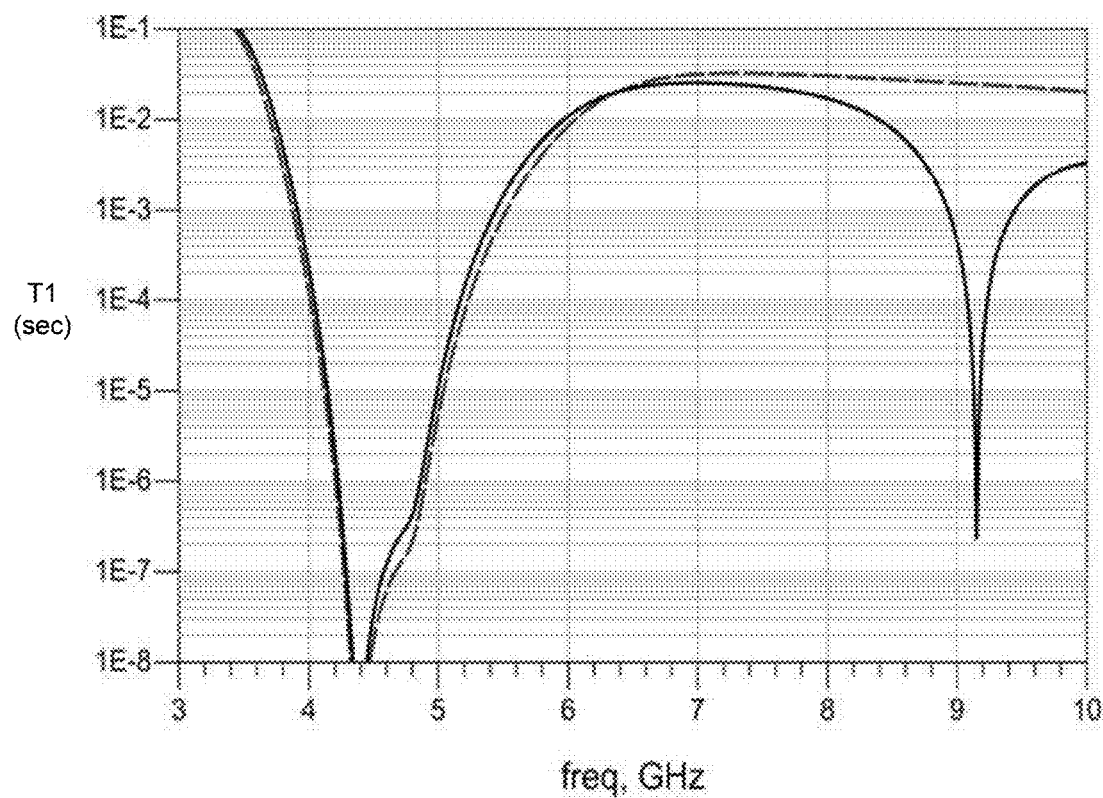
FIG. 8B illustrates a T1 plot in accordance with aspects of the technology.

FIGS. 8A-B illustrate simulations of the 3-pole filter of FIG. 4A (dashed lines) and the version of FIG. 7 (solid lines) with the extra length. FIG. 8A shows a transfer function 800 from an AC simulation. FIG. 8B. shows a plot 810 of T1 (in seconds) calculated based on simulation. As seen in FIG. 8A, both variations have flat signal pass bands, sharp turn-off skirts, and enhanced out of band rejection. And as seen in FIG. 8B, for the qubit frequency band of interest (6-8 GHz), T1 is sufficiently long to not limit the qubit coherence. For the implementations with the extra transmission line length, an additional resonance occurs (at ~9.2 GHz), which is shown in both FIGS. 8A and 8B. This resonance may be unwanted. However, in this case, the resonance frequency is high enough to be out of range for the qubit.

Figure 9A:
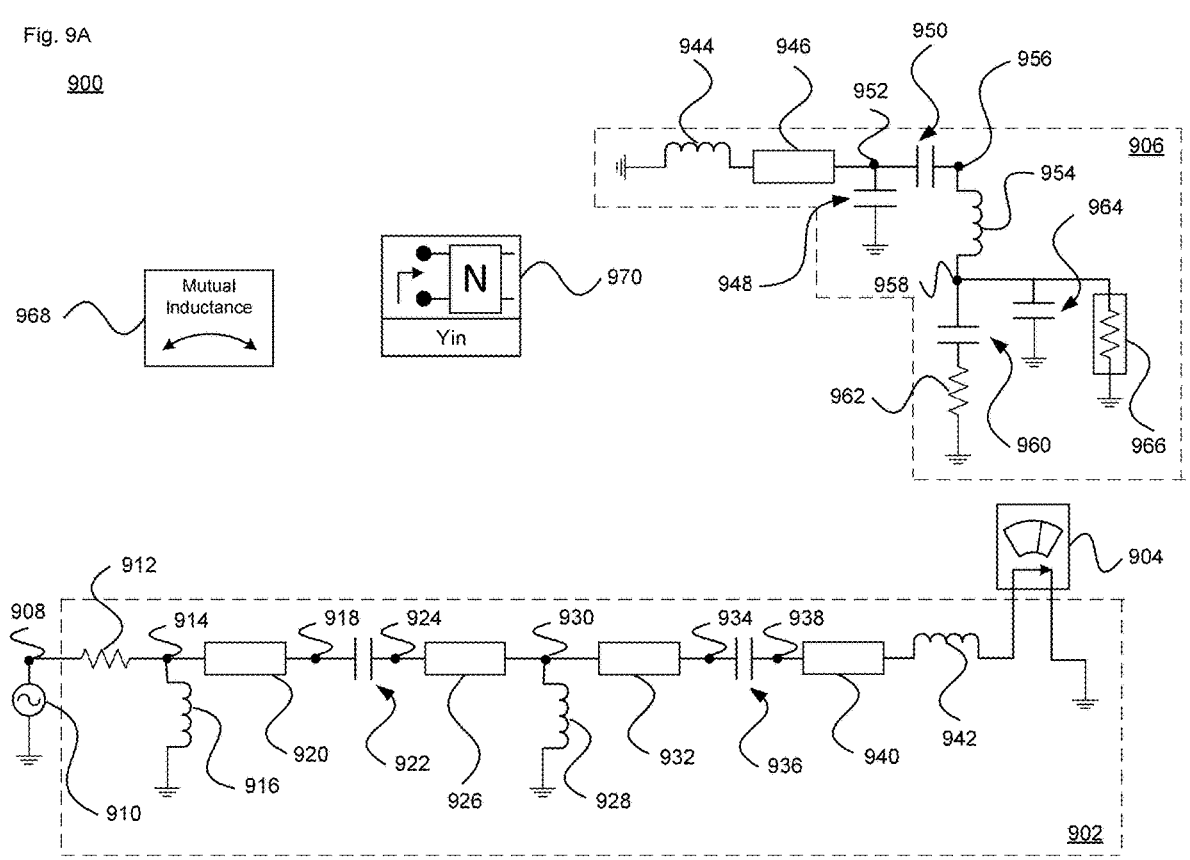
FIG. 9A illustrates a further example test arrangement in accordance with aspects of the technology.

FIG. 9A illustrates another arrangement 900 similar to FIG. 4C, but with a four pole solution. In particular, this figure presents a 4-pole Chebychev singly-terminated filter 902, probe 904 and test bench 906. As shown, node 908 has an AC voltage source 910 and a resistor element 912 coupled thereto. The resistor element 912 may have, e.g., an impedance on the order of 50 ohms. Coupled to the resistor element 912 at node 914 is a grounded inductance element 916. Between node 914 and node 918 is a first transmission line element 920. A capacitor 922 is coupled between node 918 and node 924. In series with capacitor 922 is a second transmission line element 926. Grounded inductance element 928 is coupled to transmission line element 926 at node 930. A third transmission line element 932 is coupled between node 930 and node 934. Capacitor 936 is coupled between nodes 934 and 938. A fourth transmission line element 940 is coupled on one end to node 938 and on the other end to inductance element 942. The probe 904 is arranged between the inductive element 942 and ground (the current antinode of the filter circuit).

The test bench 906 includes a grounded inductance element 944, which serves as the secondary inductance of the transformer formed with the Purcell filter (represented by mutual inductance 968). The inductance element 944 is coupled to a transmission line element 946. The transmission line element 946 is coupled to a grounded capacitor 948 and another capacitor 950 at node 952. These capacitors model the coupling of the readout resonator to the qubits at 950, and a parasitic capacitance is modeled as 948. The other end of capacitor 950 is coupled to inductance element 954, modeling a stray inductance of the qubit at node 956. The other end of inductance element 954 is coupled to node 958. One branch off of node 958 has capacitor 960 coupled to grounded resistor 962, which may have, e.g., an impedance on the order of 50 ohms, and models a qubit drive line. Another branch off of node 958 is a grounded capacitor 964, modeling the qubit capacitance. And a third branch off of node 958 is grounded termination element 966, which is de-embedded to extract T1.

There is mutual inductance between the filter 902 and the test bench 906. In particular, there is mutual inductance between inductance element 942 and inductance element 944. As noted above, block 968 indicates the mutual inductance between the filter 902 and the test bed 906. By way of example, the mutual inductance may be on the order of 20 pH (e.g., between 10-30 pH or more or less). Similar to the scenario discussed above, the inductance of element 942 may be very small (e.g., on the order of 0.02-0.07 nH). Similarly, the inductance of element 944, which is part of the resonator, may also be very small (e.g., on the order of 0.02-0.07 nH). These values are merely exemplary, and may be changed based on the filter configuration, the type of quantum device under test, etc.

As with box 660 in FIG. 6A, box 970 (labeled as $Y_{in}$) is used in the simulation to calculate the admittance seen from termination 966. This (complex) admittance can be used to calculate T1.

Figure 9B:
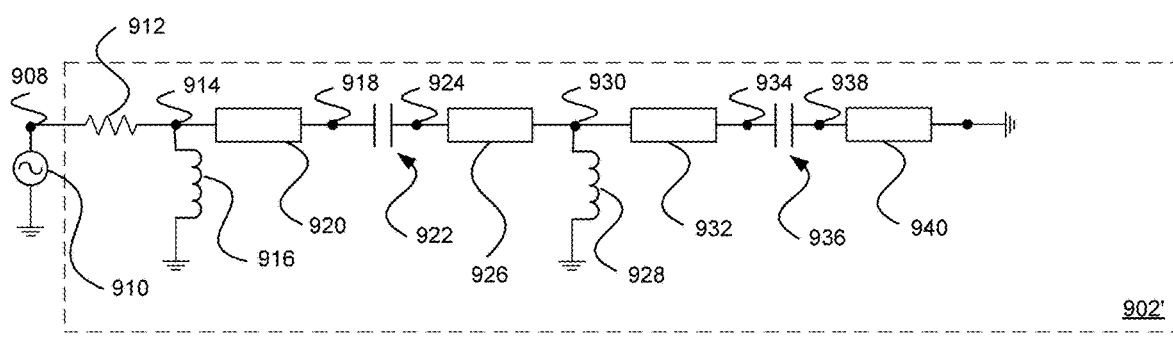
FIG. 9B illustrates an alternative configuration.

FIG. 9B presents an alternative view 900', in which the probe, test bench and inductive element 942 are omitted. This configuration is similar to the one presented in FIG. 4C, and shows a 4-pole Chebychev singly-terminated filter 902'. The discussion of the elements of filter 902 also applies to the filter 902'. During operation, there would be mutual inductance between the filter 902 and a readout module (not shown).

Figure 10A:
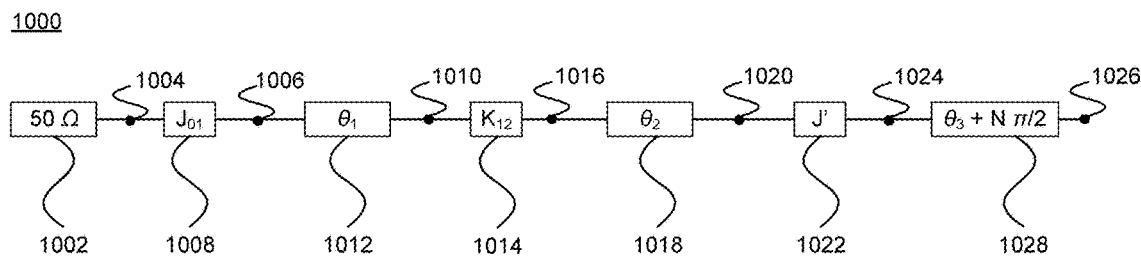
FIGS. 10A-B illustrate 3-pole topologies according to aspects of the technology.
Figure 10B:
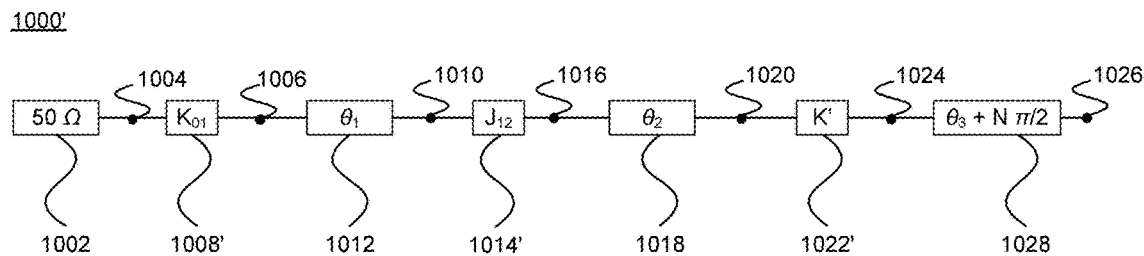

FIGS. 10A-B illustrate 3-pole topologies according to the specific arrangements discussed above. Topology 1000 of FIG. 10A is similar to the arrangement of FIG. 4C. Here, the architecture is generalized with series capacitors and a shunt inductor, as well as a last transmission line segment having an electrical length a multiple of 90 degrees. As shown in FIG. 10A, a termination element 1002 is shown to have an exemplary impedance on the order of 50 ohms (e.g., representing the impedance of the measurement device 214 of FIG. 2). Coupled to the termination element 1002 between nodes 1004 and 1006 is a first element 1008, which in this topology is a series capacitor indicated as $J_{01}$. Between node 1006 and node 1010 is a transmission line element 1012. A grounded inductance element 1014, which in this topology is a shunt inductor Ku, is coupled to nodes 1010 and 1016. Another transmission line element 1018 is disposed between nodes 1016 and 1020. Another series capacitor 1022 (J') is disposed between nodes 1020 and 1024. And between nodes 1024 and 1026 is a third transmission line element 1028, for instance corresponding to quarter-wave transmission line 210 of FIG. 2. In this topology, the third transmission line element 1028 ($\theta_3 + N \pi/2$) has an electrical length and open/short circuit status dependent upon the value of N. Each incremental N (1, 2, 3, etc.) increases the effective electrical length by 90 degrees. Here, when N is even, the filter terminates with a short circuit, and when N is odd it terminates with an open circuit. In addition, J' corresponds to $J_{23}\sqrt{N}$.

Topology 1000' of FIG. 10B is similar to the arrangement of FIG. 4A or 4B. In this topology, coupled to the termination element 1002 between nodes 1004 and 1006 is a first element 1008', which in this topology is a shunt inductor, indicated as $K_{01}$. Between node 1006 and node 1010 is the transmission line element 1012. A series capacitor element 1014', which in this topology is a capacitor $J_{12}$, is coupled between nodes 1010 and 1016. The transmission line element 1018 is disposed between nodes 1016 and 1020. Another shunt inductor 1022' (K') is disposed between the nodes 1020 and 1024. And between nodes 1024 and 1026 is the third transmission line element 1028. As with topology 1000, the third transmission line element 1028 ($\theta_3 + N \pi/2$) has an electrical length and open/short circuit status dependent upon the value of N. However, here, when N is even, the filter terminates with an open circuit, and when N is odd it terminates with a short circuit. In addition, K' corresponds to $J_{23}\sqrt{N}$.

Figure 10C:
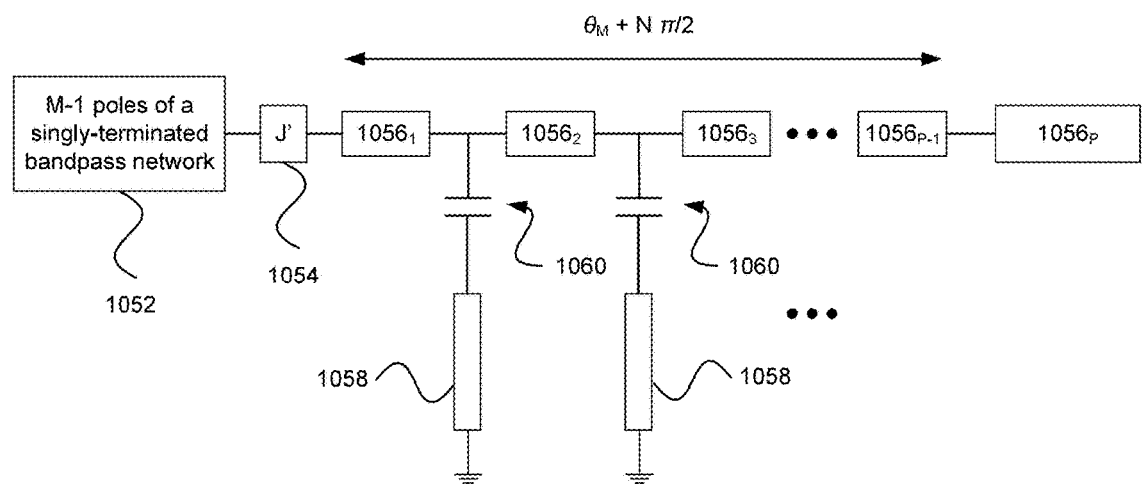
FIGS. 10C-D illustrate generalizations of the topologies of FIGS. 10A-B according to aspects of the technology.
Figure 10D:
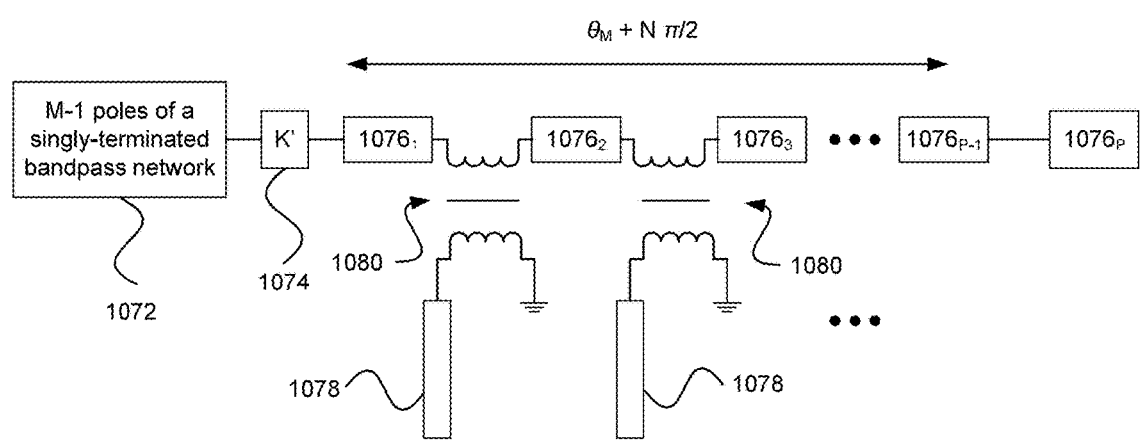

FIGS. 10C-D illustrate generalizations of the topologies of FIGS. 10A-B, respectively, and illustrate how signals may be read out. FIG. 10C presents a view 1050 showing an M-pole filter, including coupling elements (e.g., capacitors) to readout resonators. In particular, block 1052 indicates a set of M−1 poles of a singly-terminated bandpass network, for instance correlating to elements 1008 and 1014 in FIG. 10A. Block 1054, labeled as J', represents a series capacitor. In this example, J' equates to:

$$J'=J_{M-1,M}\sqrt{N}$$

Blocks $1056_1$-$1056_P$ correspond to a transmission line having a total electrical length that is an integer multiple of 90 degrees at the center frequency of the filter $\theta_M+N\pi/2$. As in the example of FIG. 10A, each incremental N (1, 2, 3, etc.) increases the effective electrical length by 90 degrees. Here, when N is even, the filter terminates with a short circuit, and when N is odd it terminates with an open circuit. And as shown, the transmission line 1056 is coupled at regular intervals to a number of readout resonators 1058 via corresponding coupling elements 1060. While the coupling elements 1060 are shown as capacitors (e.g., with capacitive coupling near the voltage anti-node of the transmission line, such as 210 of FIG. 2), transformers may alternatively be employed.

FIG. 10D presents a view 1070 showing an M-pole filter, including inductive coupling elements (e.g., transformers) to readout resonators. In particular, block 1072 indicates a set of M−1 poles of a singly-terminated bandpass network, for instance correlating to elements 1008' and 1014' in FIG. 10B. Block 1074, labeled as K', represents a shunt inductor. In this example, K' equates to:

$$K'=K_{M-1,M}\sqrt{N}$$

Blocks $1076_1$-$1076_P$ correspond to a transmission line having a total electrical length that is an integer multiple of 90 degrees at the center frequency of the filter $\theta_M+N\pi/2$. As in the example of FIG. 10B, each incremental N (1, 2, 3, etc.) increases the effective electrical length by 90 degrees. Here, when N is even, the filter terminates with an open circuit, and when N is odd it terminates with a short circuit. And as shown, the transmission line 1076 is coupled at regular intervals to a number of readout resonators 1078 via corresponding coupling elements 1080. The coupling elements 1080 are shown as transformers (e.g., with inductive coupling near the current anti-node of the transmission line, such as 210 of FIG. 2).

While various Purcell filter architectures have been illustrated in the figures and shown above, other multi-pole arrangements may be employed. In different examples, some of the Purcell filter resonant sections may be implemented as lumped element (LC) resonators instead of the transmission line elements as illustrated.

FIG. 11 illustrates an exemplary method 1100 of reading out a quantum processing unit in accordance with any of the above embodiments. At block 1102, the method includes providing a quantum processing unit having one or more qubits. The qubits are associated with a first frequency band. At block 1104, a readout module is arranged for operative communication with the quantum processing unit. The readout module has one or more readout resonators, with each readout resonator being operatively coupled to a corresponding one of the one or more qubits. The readout module is associated with a second frequency band distinct from the first frequency band. At block 1106, a Purcell filter is arranged for operative coupling to the readout module. The Purcell filter has a multi-pole circuit arrangement configured to reject signals in the first frequency band and to pass signals in the second frequency band. And at block 1108, with a measurement module operatively coupled to the Purcell filter measures signals in a passband of the Purcell filter. The measuring includes sending an input signal into the quantum processing unit and receiving the signals from the quantum processing unit that are shifted in phase or amplitude based on states of the qubits.

Unless otherwise stated, the foregoing alternative examples and embodiments are not mutually exclusive, but may be implemented in various combinations to achieve unique advantages. As these and other variations and combinations of the features discussed above can be utilized without departing from the subject matter defined by the claims, the foregoing description of the embodiments should be taken by way of illustration rather than by way of limitation of the subject matter defined by the claims. In addition, the provision of the aspects described herein, as well as clauses phrased as "such as," "including" and the like, should not be interpreted as limiting the subject matter of the claims to the specific examples or embodiments. Further, the same reference numbers in different drawings can identify the same or similar elements. The processes or other operations may be performed in a different order or simultaneously, unless expressly indicated otherwise herein.

The invention claimed is:

1. A quantum processing system comprising:
 a quantum processing unit comprising one or more qubits, the qubits being associated with a first frequency band;
 a readout module comprising one or more readout resonators, each readout resonator being operatively coupled to a corresponding one of the one or more qubits, the readout module being associated with a second frequency band distinct from the first frequency band;
 a Purcell filter operatively coupled to the readout module, the Purcell filter having a multi-pole circuit arrangement configured to reject signals in the first frequency band and to pass signals in the second frequency band; and
 a measurement module operatively coupled to the Purcell filter, the measurement module being configured to detect signals in a passband of the Purcell filter.

2. The quantum processing system of claim 1, wherein the Purcell filter has a singly-terminated arrangement enabling measurement of the one or more qubits by the measurement module in reflection from a single port.

3. The quantum processing system of claim 1, wherein the Purcell filter having the multi-pole circuit arrangement has a three pole configuration.

4. The quantum processing system of claim 3, wherein the three pole configuration is open-terminated.

5. The quantum processing system of claim 3, wherein the three pole configuration is short-terminated.

6. The quantum processing system of claim 3, wherein the Purcell filter includes:
 a first grounded inductive element coupled to a first transmission line element of a first one of the poles;
 a second grounded inductive element coupled to a second transmission line element of a second one of the poles and to a third transmission line element of a third one of the poles; and a capacitor in series between the first transmission line element and either the second or third transmission line element.

7. The quantum processing system of claim 6, wherein the third transmission line element comprises at least first and second discrete transmission line elements, the second discrete transmission line element being arranged so that the third transmission line element has an electrical length of 90 degrees at a center frequency of the filter.

8. The quantum processing system of claim 3, wherein the Purcell filter includes:
   a first capacitor coupled to a first transmission line element of a first one of the poles;
   a second capacitor coupled in series to a second transmission line element of a second one of the poles and to a third transmission line element of a third one of the poles; and
   a grounded inductive element between the first transmission line element and either the second or third transmission line element.

9. The quantum processing system of claim 3, wherein the Purcell filter includes:
   a pair of grounded transmission line elements coupled to a first transmission line element of a first one of the poles;
   a grounded inductive element coupled to a second transmission line element of a second one of the poles and to a third transmission line element of a third one of the poles; and
   a capacitor in series between the first transmission line element and either the second or third transmission line element.

10. The quantum processing system of claim 1, wherein the Purcell filter having the multi-pole circuit arrangement has a two pole configuration.

11. The quantum processing system of claim 10, wherein the two pole configuration is open-terminated.

12. The quantum processing system of claim 10, wherein the two pole configuration is short-terminated.

13. The quantum processing system of claim 1, wherein the Purcell filter having the multi-pole circuit arrangement includes:
   a grounded inductive element coupled to a first transmission line element of a first one of the poles;
   a coupling element coupled in series to a second transmission line element of a second one of the poles; and
   a capacitor in series between the first transmission line element and the second transmission line element.

14. The quantum processing system of claim 13, wherein the coupling element is one of an inductor, a capacitor or a coupled-line segment.

15. The quantum processing system of claim 1, wherein the Purcell filter having the multi-pole circuit arrangement has a four pole configuration.

16. The quantum processing system of claim 15, wherein the Purcell filter includes:
   a first grounded inductive element coupled to a first transmission line element of a first one of the poles;
   a first capacitor in series between the first transmission line element and a second transmission line element of a second one of the poles;
   a second grounded inductive element coupled to the second transmission line element and to a third transmission line element of a third one of the poles;
   a second capacitor in series between the third transmission line element and a fourth transmission line element of a fourth one of the poles; and
   a third grounded inductive element coupled to the fourth transmission line and opposite the second capacitor.

17. The quantum processing system of claim 1, wherein at least one resonant section of the Purcell filter comprises a lumped element resonator.

18. The quantum processing system of claim 1, wherein the multi-pole circuit arrangement of the Purcell filter further includes an end transmission line element arranged to provide an electrical length of an integer multiple on the order of 90 degrees at a center frequency of the filter, and which is configured for operative coupling to the readout module.

19. The quantum processing system of claim 1, wherein the first frequency band is on the order of 6-8 GHz.

20. The quantum processing system of claim 1, wherein the second frequency band is spaced at least 1 GHz from the first frequency band.

21. The quantum processing system of claim 1, wherein:
   the one or more qubits of the quantum processing unit are a plurality of qubits;
   the one or more readout resonators of the readout module are a plurality of readout resonators; and
   each of the readout resonators is operatively coupled to a corresponding one of the plurality of qubits.

22. A method of reading out a quantum processing unit, the method comprising:
   providing a quantum processing unit having one or more qubits, the qubits being associated with a first frequency band;
   arranging a readout module for operative communication with the quantum processing unit, the readout module having one or more readout resonators, each readout resonator being operatively coupled to a corresponding one of the one or more qubits, the readout module being associated with a second frequency band distinct from the first frequency band;
   arranging a Purcell filter for operative coupling to the readout module, the Purcell filter having a multi-pole circuit arrangement configured to reject signals in the first frequency band and to pass signals in the second frequency band; and
   measuring, with a measurement module operatively coupled to the Purcell filter, signals in a passband of the Purcell filter, the measuring including sending an input signal into the quantum processing unit and receiving the signals from the quantum processing unit that are shifted in phase or amplitude based on states of the qubits.

* * * * *